US006749448B2

(12) United States Patent
Bright et al.

(10) Patent No.: US 6,749,448 B2
(45) Date of Patent: Jun. 15, 2004

(54) TRANSCEIVER MODULE ASSEMBLY EJECTOR MECHANISM

(75) Inventors: Edward John Bright, Middletown, PA (US); Brian Patrick Costello, Scotts Valley, CA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/382,214

(22) Filed: Mar. 5, 2003

(65) Prior Publication Data

US 2003/0171016 A1 Sep. 11, 2003

Related U.S. Application Data
(60) Provisional application No. 60/372,861, filed on Apr. 16, 2002, and provisional application No. 60/362,185, filed on Mar. 6, 2002.

(51) Int. Cl.[7] .............................................. H01R 13/62
(52) U.S. Cl. ........................................ 439/160; 439/152
(58) Field of Search ................................. 439/160, 152, 439/362, 350; 361/747, 728, 759, 754

(56) References Cited

U.S. PATENT DOCUMENTS

| 4,414,605 | A | * | 11/1983 | Chino et al. ............... 361/707 |
| 4,597,173 | A | * | 7/1986 | Chino et al. .................. 29/741 |
| 5,316,495 | A | * | 5/1994 | Frantz ........................ 439/372 |
| 5,492,480 | A | | 2/1996 | Fusselman et al. .......... 439/157 |
| 5,647,758 | A | * | 7/1997 | Ichikawa et al. ............ 439/362 |
| 5,793,614 | A | * | 8/1998 | Tollbom ...................... 361/732 |
| 5,901,263 | A | | 5/1999 | Gaio et al. ..................... 385/92 |
| 6,142,801 | A | | 11/2000 | Koseki et al. ............... 439/159 |
| 6,335,869 | B1 | | 1/2002 | Branch et al. .............. 361/816 |
| 6,364,709 | B1 | | 4/2002 | Jones |
| 6,368,153 | B1 | | 4/2002 | Hwang |
| 6,371,787 | B1 | | 4/2002 | Branch et al. .............. 439/352 |
| 6,416,361 | B1 | | 7/2002 | Hwang |
| 6,419,523 | B1 | | 7/2002 | Jones et al. |
| 6,430,053 | B1 | | 8/2002 | Peterson et al. ............ 361/728 |
| 6,434,015 | B1 | | 8/2002 | Hwang ........................ 361/754 |
| 6,443,768 | B1 | | 9/2002 | Dirkers et al. |
| 6,478,622 | B1 | | 11/2002 | Hwang |
| 2001/0003073 | A1 | | 6/2001 | Endo ........................... 439/353 |

FOREIGN PATENT DOCUMENTS

| EP | 0 249 406 A1 | * | 12/1987 | .................. 439/350 |
| GB | 2 042 827 A | * | 9/1980 | .................. 439/350 |

* cited by examiner

Primary Examiner—Tho D. Ta

(57) ABSTRACT

An electrical module assembly is configured for latching engagement with a receptacle assembly that is adapted for mounting to a printed circuit board. The electrical module assembly comprises an ejector mechanism comprising first and second substantially parallel actuator arms adapted to extend longitudinally along a respective one of opposite side walls of the receptacle assembly. Each of the arms comprises an ejector tab extending longitudinally therewith, and a bias element extends longitudinally with and in contact with each of the actuator arms.

24 Claims, 11 Drawing Sheets

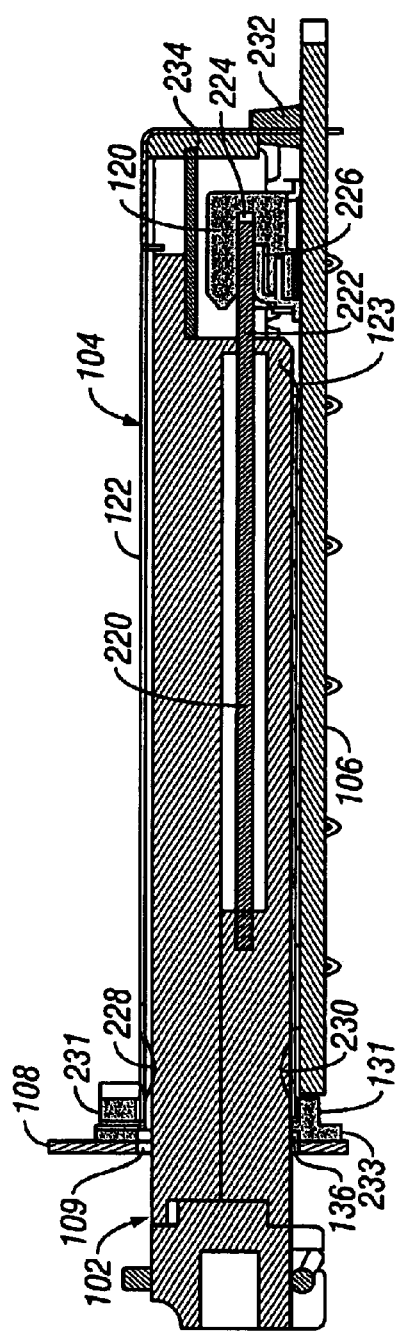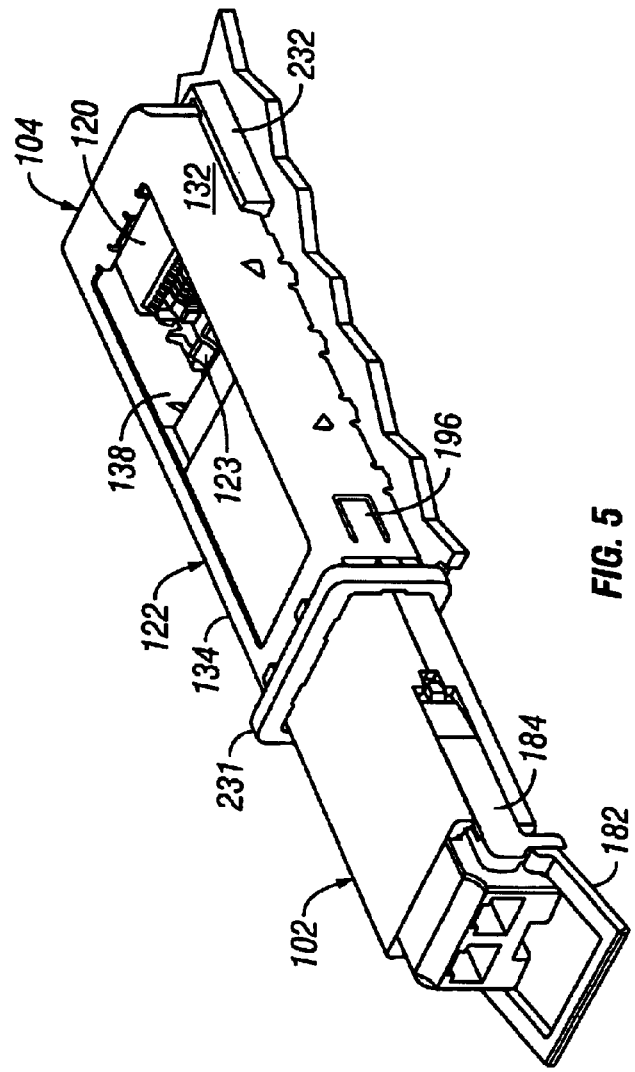
FIG. 4
FIG. 5

TRANSCEIVER MODULE ASSEMBLY EJECTOR MECHANISM

CROSS REFERENCE TO RELATED APPLICATIONS

This application claims the benefit of U.S. Provisional Application No. 60/362,185 filed Mar. 6, 2002 and U.S. Provisional Patent Application No. 60/372,861 filed Apr. 16, 2002, each of which is hereby incorporated by reference in its entirety.

BACKGROUND OF THE INVENTION

The invention relates generally to an electronic transceiver assembly, and more particularly, to a receptacle which is mounted on a circuit board and a transceiver module pluggable into the receptacle.

Various types of fiber optic and copper based transceivers that permit communication between electronic host equipment and external devices are known. These transceivers may be incorporated into modules that can be pluggably connected to the host equipment to provide flexibility in system configuration. The modules are constructed according to various standards for size and compatibility, one standard being the Small Form-factor Pluggable (SFP) module standard.

The SFP module is plugged into a receptacle that is mounted on a circuit board within the host equipment. The receptacle includes an elongated guide frame, or cage, having a front that is open to an interior space, and an electrical connector disposed at a rear of the cage within the interior space. Both the connector and the guide frame are electrically and mechanically connected to the circuit board, and when an SFP module is plugged into a receptacle it is electrically and mechanically connected to the circuit board as well. Conventional SFP modules and receptacles perform satisfactorily carrying data signals at rates up to 2.5 gigabits per second (Gbps).

A standard currently in development for a next generation of SFP modules, presently being called the XFP standard, calls for the transceiver modules to carry data signals at rates up to 10 Gbps. The transceiver modules will encounter several problems at the increased data rate not experienced previously. One problem is that the transceiver modules and the surrounding circuitry will generate significantly greater quantities of heat to be removed in order for the electronic components to survive long term. Another problem is that the transceiver modules will generate increased quantities of electro-magnetic (EM) energy at very short wavelengths. As the EM energy at the short wavelengths increases, the potential exists for more EM energy to pass through gaps in the shielding of the receptacle or guide frame. As more EM energy is accepted through the receptacle, the data signals conveyed by adjacent transceiver modules experience more EM interference (EMI). It is desirable to shield or isolate the data signals from EMI to the extent practical.

Further, conventional transceiver module assemblies include latch mechanisms to secure the transceiver module in the receptacle and to eject the transceiver module from the receptacle. It is desirable to provide a latch mechanism that is reliable, secure and robust.

There is a need to improve the design of a pluggable electronic module and receptacle in order to overcome present deficiencies and anticipated problems, among other things, due to higher data rates.

BRIEF DESCRIPTION OF THE INVENTION

According to an exemplary embodiment of the present invention, an electrical module assembly is provided. The module assembly is configured for latching engagement with a receptacle assembly that is adapted for mounting to a printed circuit board. The electrical module assembly comprises an ejector mechanism comprising first and second substantially parallel actuator arms adapted to extend longitudinally along a respective one of opposite side walls of the receptacle assembly. Each of the arms comprises an ejector tab extending longitudinally therewith, and a bias element extends longitudinally with and in contact with each of the actuator arms.

In another exemplary embodiment of the invention, an electrical module assembly is provided. The module assembly is configured for latching engagement with a receptacle assembly that is adapted for mounting to a printed circuit board. The electrical module assembly comprises first and second side walls. Each of the first and second side walls include a retention cavity, and each of the first and second side walls is configured for slidable insertion into a guide frame of the receptacle assembly. An ejector mechanism comprises first and second actuator arms adapted to extend longitudinally adjacent a respective one of opposite side walls of the guide frame. Each of the arms comprise an ejector tab extending longitudinally therewith and configured to deflect a latch tab formed in each of the side walls of the guide frame. A longitudinally extending bias element abuts each of the actuator arms.

In another exemplary embodiment of the invention, an electrical module assembly is provided. The module assembly comprises a receptacle assembly comprising a guide frame having a top wall, a bottom wall and opposite side walls. Each of the side walls comprise a latch tab therein, and a transceiver module assembly is configured for insertion into the guide frame. The transceiver module assembly comprises opposite side surfaces extending adjacent the side walls of the guide frame when the module assembly is inserted into the guide frame. Each of the side surfaces of the module assembly comprise a retention cavity for engagement with a respective one of the latch tabs of the receptacle assembly. An ejector mechanism comprises first and second substantially parallel actuator arms adapted for sliding engagement with the retention cavities of the module assembly. The actuator arms are positionable longitudinally adjacent a respective one of the side walls of the guide frame, and each of the arms comprise an ejector tab extending longitudinally therewith and configured to deflect a respective one of the latch tabs of the guide frame. A bias element extends longitudinally with each of the actuator arms.

In an exemplary embodiment, a pivotally mounted bail comprises a foot portion oriented at an obtuse angle, and the foot portion contacts the bail in a latched position and in an unlatched position. The retention cavities are shaped complementary to an outer profile of the contact arms, and each of the retention cavities includes a shoulder. The shoulder provides a seat for a respective one of the bias elements. Each of actuator arms includes an interior surface, and the interior surface has a slot for retaining the bias element. The actuator arms include a stepped surface which is received in each of the retention cavities.

BRIEF DESCRIPTION OF THE DRAWINGS

FIG. 4 is a cross sectional view of the assembly illustrated in FIG. 3 taken along line 4—4.

FIG. 5 is a perspective view of the assembly shown in FIG. 2 in an unlatched position.

DETAILED DESCRIPTION OF THE INVENTION

Figure 1:
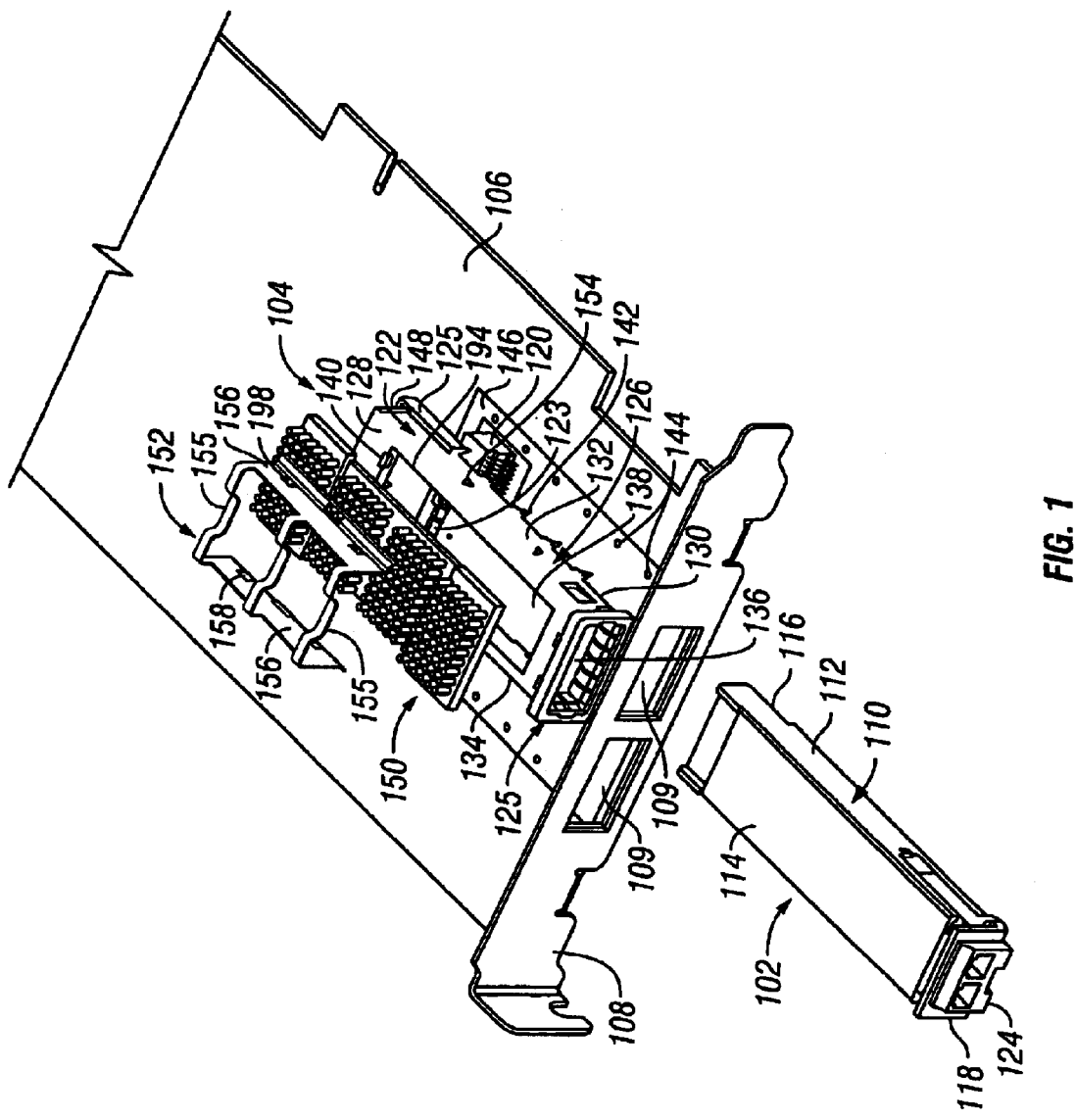
FIG. 1 is an exploded perspective view of a module assembly and a receptacle assembly formed in accordance with an embodiment of the invention.

FIG. 1 illustrates a module assembly and receptacle assembly 100 formed in accordance with an exemplary embodiment of the invention. For the reasons set forth in detail below, assembly 100 is adapted to address, among other things, heat dissipation and electromagnetic shielding for components conveying data signals at high rates, such as data transmission rates of 10 gigabits per second (Gbs). It is appreciated, however, that the benefits and advantages of the invention may accrue equally to other data transmission rates and across a variety of systems and standards. Therefore, while the invention is described and illustrated in the context of assembly 100, the invention is not intended to be limited to assembly 100, and assembly 100 is therefore provided for purposes of illustration rather than limitation.

As shown in FIG. 1, assembly 100 generally includes a module assembly 102 configured for pluggable insertion into a receptacle assembly 104 that is mounted to a host circuit board 106, which, in turn, is mounted in a host system such as a router or computer (not shown). The host system typically includes a conductive chassis having a bezel 108 including openings 109 therethrough in substantial alignment with a respective receptacle assembly 104. The module assembly 102 is inserted into the receptacle assembly 104 through the bezel opening 109, and the receptacle assembly 104 is electrically connected to the bezel 108.

In an illustrative embodiment, the module assembly 102 includes a housing 110 including a base 112 and a cover 114 that are secured together to form a protective shell for a circuit board (not shown in FIG. 1) that is disposed within the housing 110. The circuit board carries electronic circuitry and devices that perform transceiver functions in a known manner. An edge of the circuit board is exposed through a rear 116 of the housing 110, and the circuit board edge is pluggable into the receptacle assembly 104 as described below. The module assembly 102 is adapted for installation into the receptacle assembly 104 such that a front end 118 of the module assembly 102 is extended therefrom.

The module assembly 102 is configured to be inserted into the receptacle assembly 104. In general, the module assembly 102 and receptacle assembly 104 may be used in any application requiring an interface between a host system and electrical or optical signals. The module assembly 102 interfaces to the host system through the receptacle assembly 104 via a receptacle connector 120 which is located within a receptacle guide frame 122, also referred to as a cage. The module assembly 102 interfaces to an optical fiber or electrical cable (not shown) through a connector interface 124 at a front end 118 of the module assembly 102. Preferably, the connector interface 124 comprises a mechanism that cooperates with a fiber or cable assembly to secure the fiber or cable assembly to the module assembly 102. Suitable connector interfaces 124 are known and include adapters for the LC style connectors and the HSSDC2 copper connectors offered by Tyco Electronics Corporation (Harrisburg, Pa.).

The module assembly 102 and the receptacle assembly 104 reduce EMI emission through one or more of several EMI reduction features, including guide frame 122, a gasket assembly 125 coupled to a forward end of the guide frame 122 that interfaces with bezel 108, and intermediate and rear gasket assemblies 123, 125, all described below in more detail.

As illustrated in FIG. 1, the guide frame 122 includes a stamped and formed metal body 126 that defines a shell having a top wall 128, a bottom wall 130, and side walls 132, 134. Front edges of each of the top, bottom and side walls 128–134 are formed as flanges which surround a front opening 136 into the guide frame 122. The top wall 128, the bottom wall 130, and the side walls 132, 134 define a cavity 138 therebetween for receiving the module assembly 102 through an opening 136 in the front end of the guide frame 122. The bottom wall 130 has a bottom opening to receive the receptacle connector 120. The guide frame 122 has a positive stop 140, which engages a surface of the module assembly 102 to prevent the module assembly 102 from passing too far rearwardly through the guide frame 122. When the module assembly 102 is inserted into the receptacle assembly 104, the guide frame 122 provides conductive walls on all sides thereof. Bottom wall 130 of guide frame 122 includes compliant pin leads 142 that are received within through-holes 144 of the host board 106 and provide a conductive path to ground of an equipment chassis when the receptacle assembly 104 is mounted therein. Host board 106 includes a conductive surface 146 provided thereon and formed as a sheet to underlie receptacle assembly 104 to enhance the electromagnetic interference shielding.

The receptacle connector 120 is mounted on the circuit board 106 of the host equipment along with the guide frame 122, but separated from conductive surface 146 of host board 106. The receptacle connector 120 may be, for example, that which is sold under part number 788862-1 by Tyco Electronics Corporation. The receptacle connector 120 includes a slot that receives an edge of the circuit board that is carried by the module assembly 102 when the module assembly 102 is fully installed in the guide frame 122, thereby electrically connecting the module assembly 102 to the host equipment.

The top wall 128 of the guide frame 122 has a large opening 194 overlying cavity 138 that accommodates a heat sink 150. The heat sink 150 is positioned to make physical contact with the module assembly 102 when the module assembly 102 is installed into the receptacle assembly 104. A clip 152 is mounted over the heat sink 150 and is secured to the guide frame 122. The clip 152 ensures that the heat sink 150 is loaded against the module assembly 102 to facilitate thermal transfer from the module assembly 102 to the heat sink 150. The heat sink 150 includes an engagement surface (described below) that faces and is located proximate the interior cavity 138 of the guide frame 122. The engagement surface of the heat sink 150 is configured to physically contact and abut against the module assembly 102 when installed in the interior cavity 138.

A retention tab 154 is formed on each of the side walls 132, 134 of the guide frame 122. The retention tabs 154 engage the clip 152 which, in turn, retains the heat sink 150 on the guide frame 122. Clip 152 securely engages the guide frame 122 to retain the heat sink 150 upon the guide frame 122. The clip 152 includes resilient spring members 155 secured over heat sink 150. The spring members 155 flex to permit the heat sink 150 to move outward away from the guide frame 122 when the module assembly 102 is installed. The spring members 155 exert a desired force against the heat sink 150 to maintain a desired abutting interface to facilitate thermal transfer and heat dissipation from the module assembly 102. The clip 152 further includes side rails 156 that snap over the side walls 132, 134 of the guide frame 122. The side rails 156 are joined to one another by spring members 155 that extend over, and flexibly engage, the heat sink 150.

Figure 2:
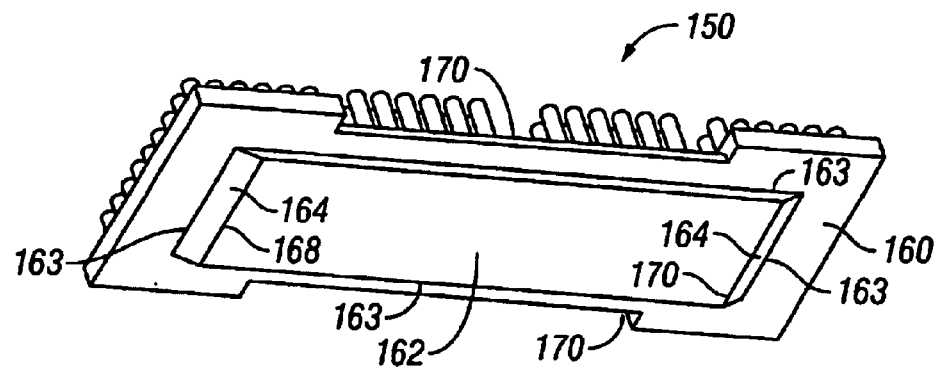
FIG. 2 is a bottom perspective view of the heat sink shown in FIG. 1.

FIG. 2 illustrates a bottom perspective view of heat sink 150 including a peripheral outer surface 160 and module engagement surface 162 that is stepped relative to the peripheral surface 160 to extend into the interior cavity 138 of the guide frame 122. The peripheral surface 160 surrounds the engagement surface 162 on the periphery or perimeter 163 thereof, and the peripheral surface 160 is recessed relative to a plane extending through the engagement surface 162. In one embodiment, the engagement surface 162 is approximately centered within the peripheral surface 160, and a ramped transition portion 164 extends on each of the leading edges 168, 170 of the engagement surface 162. Notched or cut out portions 170 are formed in the longitudinal side walls of the heat sink 150 to accommodate clip 152 (shown in FIG. 1) when the heat sink 150 is installed.

The engagement surface 162 of the heat sink 150 rests within the interior cavity 138 of the guide frame 122 at a level that interferes with an installation path of the module assembly 102. The heat sink 150 is moved outward by the module assembly 102, as further described below, when the module assembly 102 is installed to provide an abutting interface between the heat sink 150 and the module assembly 102.

Returning to FIG. 1, when the module assembly 102 is removed, the engagement surface 162 of the heat sink 150 rests within the interior cavity 138 of the guide frame 122 at a level that interferes with an installation path of the module assembly 102. The heat sink 150 is movable outward by the module assembly 102 when the module assembly 102 is installed to provide an abutting interface between the heat sink 150 and module assembly 102. The engagement surface 162 of the heat sink 150 is flat and smooth to slide along a mating surface of the module assembly 102 when the module assembly 102 is installed.

In a further and/or alternative embodiment, a thermal interface material (not shown) is disposed on the engagement surface 162 of the heat sink 150 and the cover 114 of the module assembly 102. The thermal material is compressed between the engagement surface 162 of the heat sink 150 and the cover 114 when the module assembly 102 is installed. In such an embodiment, in order to avoid abrasion and damage to the thermal interface material as the module assembly 102 is installed into the guide frame 122, an underside of the heat sink 150 may include an array of bosses that correspond with an array of apertures in a top surface of the module assembly 102. The bosses may slide along the top surface of the module assembly 102 and serve as standoffs to maintain the thermal interface material at a specified height above the module assembly 102 as the module assembly 102 is being installed into the guide frame 122. When the module assembly 102 is fully inserted into the guide frame 122, the bosses are aligned with and engage the apertures, thereby compressing the thermal interface material between the module assembly 102 and the heat sink 150, which promotes heat transfer.

Figure 3:
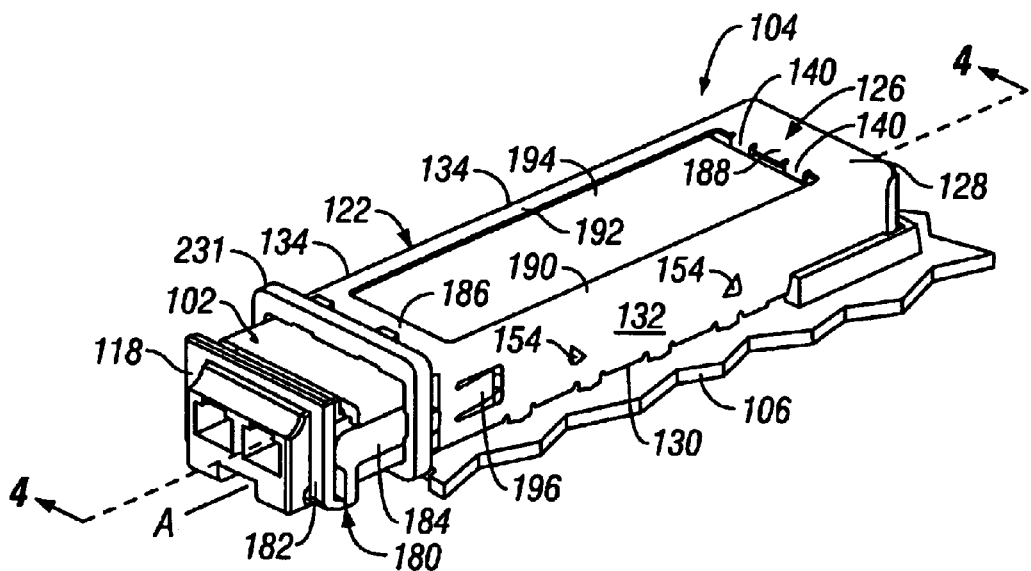
FIG. 3 is an assembled perspective view of a portion of the assembly shown in FIG. 1, showing the module assembly in a latched position within the receptacle assembly.

FIG. 3 is a perspective view of receptacle assembly 104 mounted to the host board 106 and receiving the module assembly 102, with heat sink 150 and clip 152 removed for clarity. Also, bezel 108 is not shown in FIG. 3.

Module assembly 102 is illustrated in a latched position wherein removal from the guide frame 122 is prevented. An axial pull on the front end 118 of the module assembly 102 in the direction of arrow A, when latched, is ineffective to remove the module assembly 102. In the latched position, front end 118 of the module assembly 102 extends or protrudes outwardly a specified distance from an EMI gasket collar 231 which is positioned in abutting contact with an interior surface (not shown in FIG. 3) of bezel 108 (shown in FIG. 1) in use. Bezel 108 includes a gasket 233, described below in relation to FIG. 4, that is permanently fastened thereto, and the collar 231 is positioned in contact with the gasket 233 for EMI shielding. Referring back to FIG. 3, the module assembly 102 is extended through collar 231 and guide frame 122. An ejector mechanism 180 is provided on the front end 118 of module assembly 102 and includes a rotatably mounted bail 182 and spring-loaded actuator arms 184 extending on opposite sides thereof in a generally parallel direction to the side walls 132, 134 of guide frame 122. Construction and operation of ejector mechanism 180 is described below.

Guide frame 122 includes a conductive body 126 that is formed from a metallic sheet plated with tin/lead in an exemplary embodiment. The body 126 is formed into a shell having a top wall 128, a bottom wall 130, and side walls 132, 134. The top wall 128, the bottom wall 130, and the side walls 132, 134 define the cavity 138 (shown in FIG. 1) in which module assembly 102 is received.

The top wall 128 of the guide frame 122 includes a front portion 186, a rear portion 188, and opposed lateral portions 190, 192 that define a perimeter of the opening 194. The portions 186–192 of the top wall 128 also define a maximum distance that the heat sink 150 (shown in FIGS. 1 and 2) extends into the interior cavity 138 (shown in FIG. 1) in which the module assembly 102 is contained. The top wall 128 supports the heat sink 150 when the heat sink 150 is mounted over the opening 194. Retention tabs 154 are punched from each of the respective side walls 132, 134 and bent outwardly. Tabs 154 engage mating openings 198 in the side rails 156 (shown in FIG. 1) in clip 152 (also shown in FIG. 1) when the heat sink 150 is attached to guide frame 122. In an exemplary embodiment, tabs 154 are triangular in shape, which restricts the clip 152 from movement in both a vertical and horizontal direction relative to the guide frame 122, although it is recognized that other shapes for tabs 154 may be employed.

The rear portion 188 of the top wall 128 includes positive stops 140 in the form of downwardly extending tabs that project slightly inward into opening 194 and downward into cavity 138. The stops 140 engage a rear surface of the module assembly 102 to prevent the module assembly 102 from passing rearwardly through the guide frame 122 beyond a specified distance. Each of the side walls 132, 134 of the guide frame 122 includes a latch element 196 that engages a respective actuator arm 184 of ejector mechanism 180. In the illustrated embodiment, latch elements 196 are rectangular tabs punched from the respective side walls 132, 134 and bent inwardly into the interior of the cavity 138 of the guide frame 122. When module assembly 102 is inserted in the guide frame 122, latch elements 196 contact the side outer surfaces of the housing 110 (shown in FIG. 1) of the module assembly 102 and resiliently deflect outwardly to permit insertion of the module assembly 102. Once the module assembly 102 is inserted a predetermined distance into the guide frame 122, the latch elements 196 return to the latched position illustrated in FIG. 3 in engagement with the actuator arms 184.

FIG. 4 is a cross sectional view of the module assembly 102 coupled to the receptacle assembly 104 with the module assembly 102 in the latched position. The module assembly 102 includes a printed circuit board 220 therein. An end 222 of the printed circuit board 220 is received in a slot 224 of the receptacle connector 120 which is mechanically and electrically mounted to the host board 106. The receptacle connector 120 includes electrical contacts 226 that contact conductive terminations on the end of the printed circuit board 220 to establish electrical connection to conductive paths on the host board 106. When the module assembly 102 is inserted in to the guide frame 122, the end 222 of the printed circuit board 220 is inserted into the connector slot 224, and when the module assembly 102 is fully inserted into the guide frame 122, the module assembly 102 is locked in the latched position with the printed circuit board 220 fully engaged to the receptacle connector 120.

FIGS. 4 and 11–13 illustrate resilient metal spring gaskets 228, 230 that are provided in the forward end of the guide frame 122 proximate a conductive collar 231 described below. Gaskets 228, 230 and collar 231 provide grounding contact with outer surfaces of the module assembly 102 to facilitate electromagnetic shielding when the module assembly 102 is installed. To further prevent EMI leaks through front opening 136 of guide frame 122, a gasket 233 (shown in FIG. 4) is positioned between collar 231 and an interior surface of bezel 108. Gasket 233 surrounds the opening 109 in the bezel 108 and is compressed by the forward end of the guide frame 122 during assembly. In an exemplary embodiment, gasket 233 is fabricated as a pad from a conductive foam material, such as that commercially available from Laird Technologies of Delaware Water Gap, Pa. The pad includes a hole or opening therethrough that is aligned with bezel opening 109 as the gasket 233 is installed and secured to a rear surface of the bezel 108, such as with a known adhesive. The collar 231 directly and compressively engages the gasket 233 and provides a continuous EMI shield interface between the guide frame 122 and the bezel 108.

Additionally, referring back to FIG. 4, an intermediate EMI gasket 123 is positioned forward of the receptacle connector 120 and also provides a grounding contact to the outer surface of the module assembly 102 to provide EMI shielding in an intermediate portion of the module assembly 102. Gasket 123 also contacts the ground surface 146 (shown in FIG. 1) of the host circuit board 106. EMI gaskets 232, 234 are further provided at the rear of the guide frame 122 for additional EMI shielding. The foregoing EMI gasket features are further described in detail below.

FIG. 5 is a perspective view of the module assembly 102 partly inserted into receptacle assembly 104 and in an unlatched or released position. Bail 182 is positioned in an unlatched position which, as described below, causes actuator arms 184 to release from latch elements 196 in the side walls 132, 134 of the guide frame 122. The receptacle connector 120 is positioned in the rear of the cavity 138 in the guide frame 122, and the receptacle connector 120 is soldered to the host board 106. Guide frame 122 is electrically connected to the conductive surface 146 (shown in FIG. 1) of the host board 106 to provide an electromagnetic shielding cage about the module assembly 102 when coupled to the receptacle connector 120 in the latched position. Intermediate EMI gasket 123 is located in a lower portion of the cavity 138 forward of the receptacle connector 120. A rear EMI gasket 232 is disposed about the outer periphery of the rear end of the guide frame 122 adjacent the host board 106.

Figure 6:
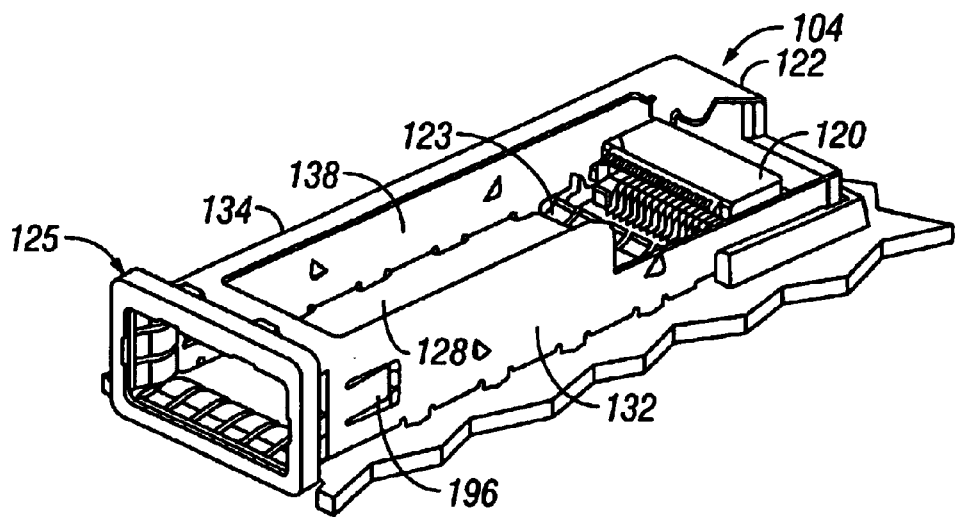
FIG. 6 is a partly broken away perspective view of the receptacle assembly shown in FIGS. 1 and 3–5.

FIG. 6 is a partly broken away perspective view of the receptacle assembly 104 with the module assembly 102 removed. The receptacle connector 120 is positioned in the rear end of the cavity 138 to receive the printed circuit board 220 (shown in FIG. 4) of the module assembly 102 (shown in FIG. 4). Intermediate EMI gasket 123 extends upwardly from the bottom wall 130 of the guide frame 122 into the path of the module assembly 102 when inserted into the cavity 138 of the guide frame 122. Latch elements 196 extend inwardly from the side walls 132, 134 of the guide frame 122 into the cavity 138 and also into the path of the module assembly 102. A front end of the guide frame 122 includes an EMI gasket assembly 125 described below.

Figure 7:
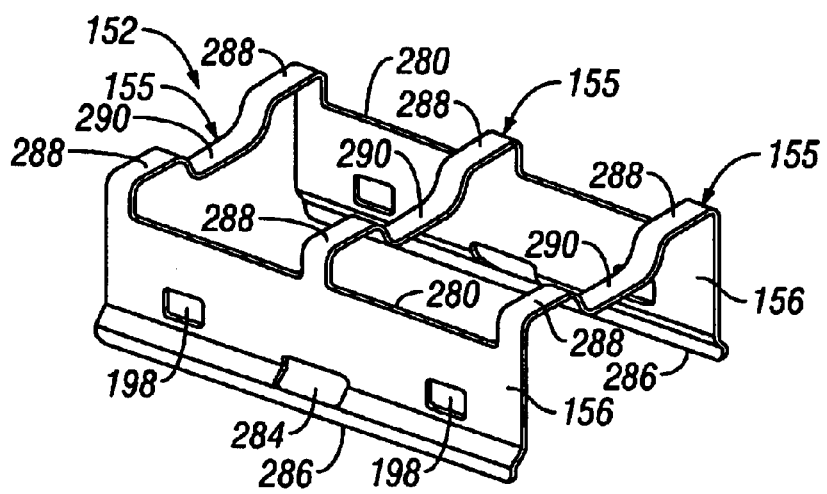
FIG. 7 is a perspective view of a clip for the assembly shown in FIG. 1.

FIG. 7 is a perspective view of clip 152 which couples the heat sink 150 to the guide frame 122 (shown in FIGS. 1–5). Clip 152 includes opposite side rails 156 connected by spring members 155 extending from upper edges 280, and the side rails 156 each include engagement openings 198 for interfacing engagement with tabs 154 (shown in FIGS. 1 and 2) in the side walls 132, 134 of the guide frame 122. Side rails 156 each further include a release aperture 284 that facilitates insertion of a tool, such as a screwdriver, to remove clip 152 from the side walls 132, 134 of the guide frame 122. A screwdriver or other tool may be inserted in release aperture 284 to permit prying of the side rails 156 away from the guide frame 122, thereby releasing the rails 156 from beneath the tabs 154 and permitting removal of the clip 152 from the guide frame 122. Side rails 156 further include outwardly flared lower edges 286 to facilitate insertion of clip 152 over the sides of heat sink 150 and the side walls 132, 134 of the guide frame 122.

In an exemplary embodiment, the spring members 155 extend substantially vertically upward from the upper edges 280 of the side rails 156. Each spring member 155 includes opposite elevated portions 288 extending substantially perpendicular to respective side rails 156, and a depressed portion 290 extending between the elevated portions 288. As such, the spring members 155 may resiliently flex as the side rails 156 are separated for installation to the guide frame 122, while providing a snug and secure fit to the guide frame 122.

Figure 8:
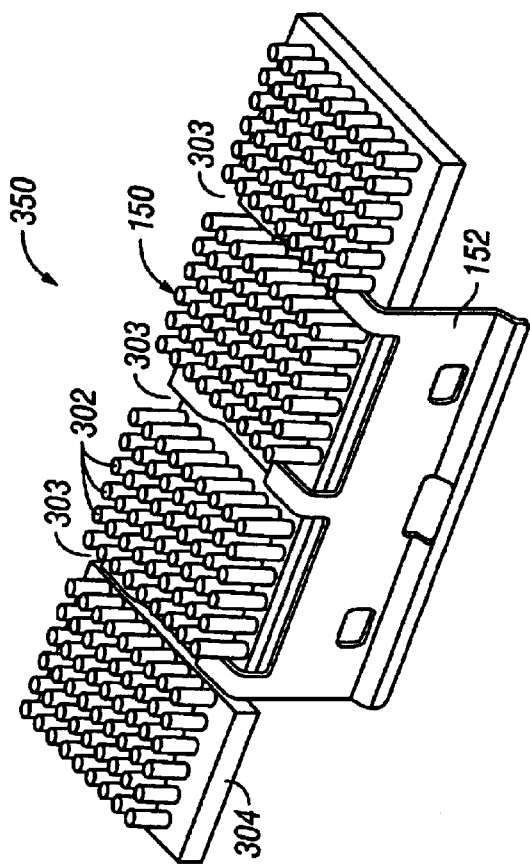
FIG. 8 is a perspective view of a heat sink assembly formed in accordance with an embodiment of the invention.

FIG. 8 illustrates a heat sink assembly 300 including clip 152 fitted to the heat sink 150. The heat sink 150 includes a number of heat transfer pins 302 arranged in rows and columns and extending upwardly from a generally rectangular base 304. Spring members 155 of clip 152 extend between selected rows of pins 302 that are spaced apart by gaps 303. Depressed portions 290 of spring members 155 contact the heat sink base 304.

In the illustrated embodiment, four sections of pins 302 are provided and each section includes fifty-four substantially cylindrical pins 302 extending upward from the base 304. Adjacent sections of pins 302 are separated by one of three spring members 155 provided in clip 152. It is recognized, however, that a greater or fewer number of pins, pin sections, and spring members may likewise be employed in alternative embodiments of the invention. Additionally, it is understood that other shapes and configurations of pins 302, fins and/or bases 304 may be employed in alternative embodiments of the invention.

Figure 9:
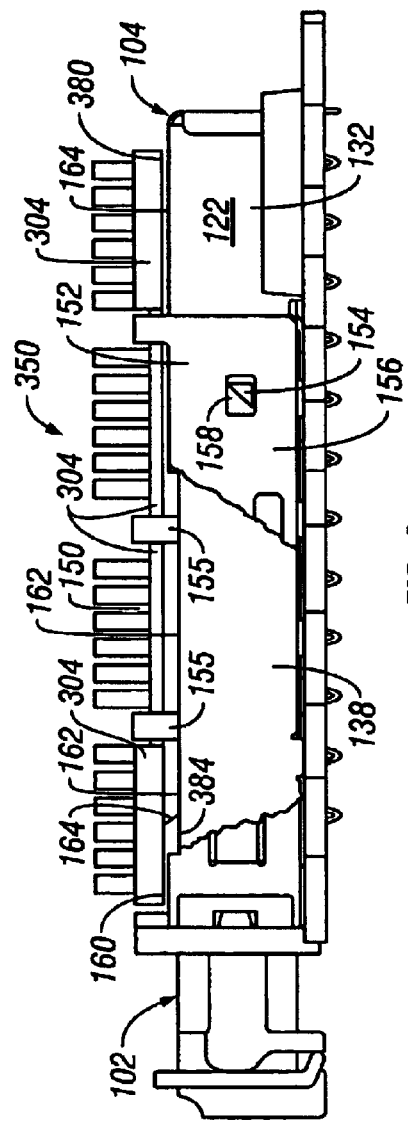
FIG. 9 is a side elevational view, partly broken away, of the heat sink assembly shown in FIG. 8 attached to the receptacle assembly.

FIG. 9 illustrates the heat sink assembly 350 coupled to the guide frame 122 and with the module assembly 102 inserted therein. Heat sink assembly 350 is installed over the cavity 138 in the guide frame 122 and the tabs 154 in the side walls 132, 134 of the guide frame 122 are received in the apertures 198 in the side rails 156 of the clip 152. The clip 152 positions a lower engagement surface 162 of the heat sink 150 in the path of the module assembly 102. As shown in the broken away portion of FIG. 9 (and also shown in FIG. 2), in an exemplary embodiment the base 304 includes a lower peripheral surface 160 surrounding the engagement surface 162. The peripheral surface 160 is recessed with respect to a plane containing the engagement surface 162, or in other words, the engagement surface 162 extends outwardly from the peripheral surface 160 toward a top surface 384 of the module assembly 102. The opposed lateral portions 186, 188, 190, 192 (shown in FIG. 3) of the top wall 128 of the guide frame 122 support the peripheral surface 160 of the heat sink 150 when the module assembly 102 is not installed.

As the module assembly 102 is inserted into the cavity 138 of the guide frame 122, the top surface 384 of the module assembly 102 upwardly displaces the engagement surface 162 of the heat sink 150 against the bias of clip 152. Consequently, the clip 152 provides a downward bias or pressure via spring members 155 to maintain the two surfaces 162, 384 in contact for optimal heat transfer therebetween. Ramped transition portion 164 extends between the heat sink engagement surface 162 and the peripheral surface 160 to facilitate smooth engagement of the heat sink engagement surface 162 and the top surface 384 of the module assembly 102 during installation and removal from the receptacle assembly 104. Additionally, the engagement surface 162 is flat and smooth to facilitate sliding insertion of the module assembly 102. While heat transfer between the heat sink 150 and module assembly 102 is provided through metal-to-metal contact of the module top surface 384 and the heat sink engagement surface 162, it is understood that a thermal interface material could be incorporated in further and/or alternative embodiments to enhance or alter the heat transfer relationship.

Figure 10:
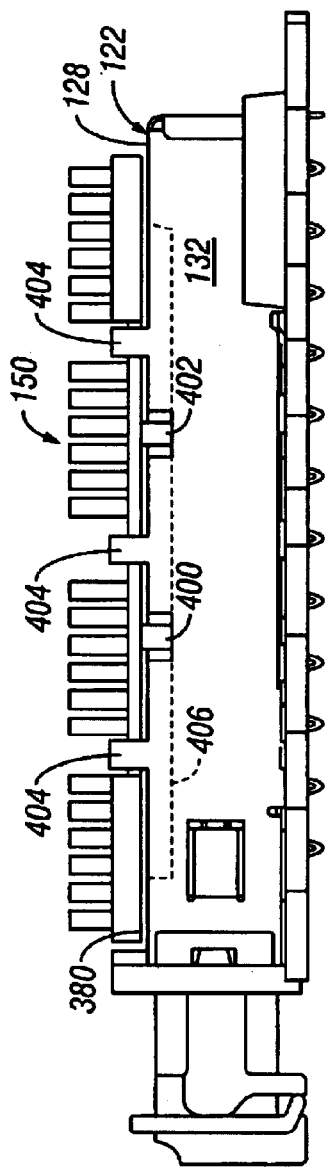
FIG. 10 illustrates another heat sink assembly attached to a receptacle assembly formed in accordance with an alternative embodiment of the present invention.

FIG. 10 illustrates another embodiment wherein the peripheral surface 160 of the heat sink 150 resides on tabs 400, 402 that are formed along the top edge of each side wall 132, 134 of the guide frame 122. The heat sink 150 is secured to the guide frame 122 by spring members 404 integrally provided with the side walls 132, 134. The spring members 404 exert a downward biasing force on the heat sink 150. Unlike spring members 155 (shown in FIGS. 1, 6 and 8), spring members 404 do not extend across the width of the guide frame 122, but rather only extend across the heat sink 150 a sufficient distance to retain the heat sink 150 in position.

In a further alternative embodiment, the guide frame 122 includes notched out portions 406 (shown in phantom in FIG. 10) in the side walls 132, 134 and/or the lateral portions 188–192 (shown in FIG. 3) of the top wall 128 of the guide frame 122. In such an embodiment, the heat sink 150 rests on the edges of the side walls 132, 134 and/or the lateral portions 188–192 of the top wall 128 in the notched out portions 406.

Figure 11:
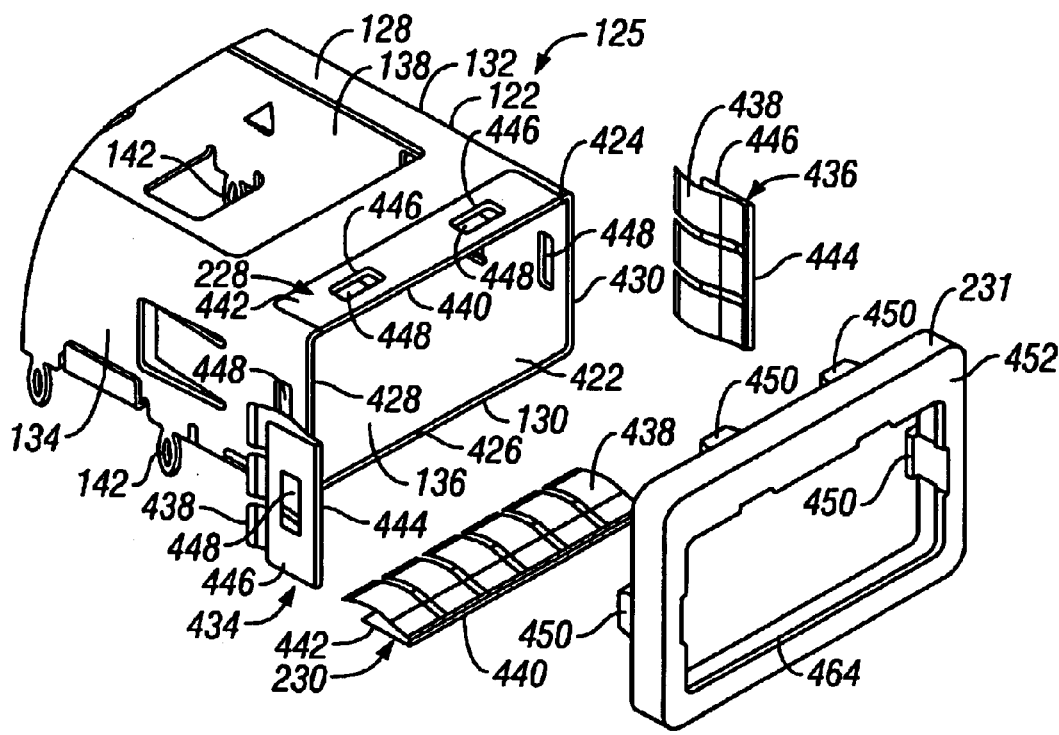
FIG. 11 illustrates a module interface of the receptacle assembly including an electromagnetic interference shielding gasket assembly formed in accordance with an embodiment of the invention.
Figure 12:
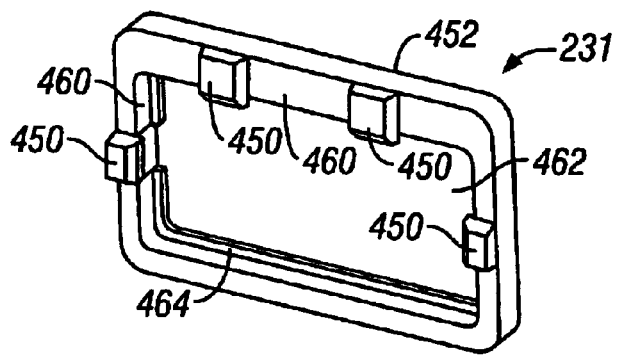
FIG. 12 is a perspective view of a collar for the gasket assembly shown in FIG. 12.
Figure 13:
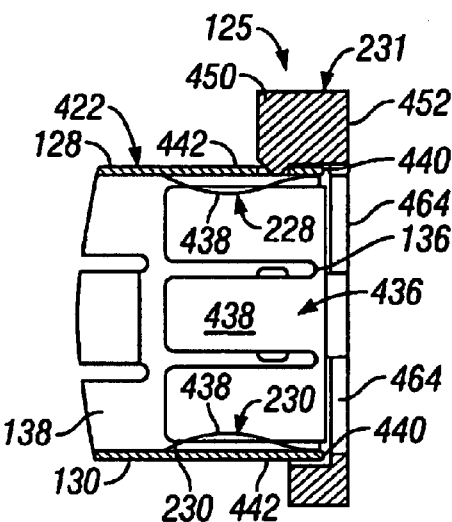
FIG. 13 is a cross sectional view of the gasket assembly shown in FIG. 11 installed on the receptacle assembly.

FIGS. 11–13 illustrate an EMI shielding gasket assembly 125 for shielding the forward or front end 422 of the guide frame 122 proximate the bezel 108 (shown in FIGS. 1 and 3) to prevent undesirable electromagnetic interference from leaking through the front end 422. Front end 422 includes a top edge 424, a bottom edge 426, and side edges 428, 430 which are formed as flanges surrounding and defining an outer periphery of the opening 136. Opening 136 provides access to cavity 138 defined by the walls of the guide frame 122. An electrically conductive gasket 228, 230, 434, 436 is installed on each respective edge 424, 426, 428, 430 of the front end 422. The gasket 228 is illustrated in an installed position over the top edge 424 in FIG. 11, and FIG. 13 illustrates the gasket assembly 125 installed to the front end 422.

Each of the gaskets 228, 230, 434, 436 is bent so that it extends through the opening 136 and partially into the interior cavity 138 of the guide frame 122 when the gaskets are installed, as best illustrated in FIG. 13. Each gasket 228, 230, 434, 436 has resilient straps 438 of an arched configuration, and the straps 438 contact the module assembly 102 in the top, bottom and side walls of the module assembly 102 to provide a barrier for EMI. The flanges or edges 424–430 with the gaskets 228, 230, 434, 436 fitted thereon are abutted against the bezel 108 of the electronic host equipment. That is, the gaskets 228, 230, 434, 436 are sandwiched between respective flanges 424–430 and the bezel 108, with the front opening 136 in the guide frame 122 being aligned with an opening 109 (shown in FIGS. 1 and 4) in the bezel 108 to permit insertion of the module assembly 102 into the guide frame 122.

The gaskets 228, 230, 434, and 436 are adapted to reduce any gaps between the flanges 424–430 and the bezel 108, and also to reduce any gaps between the module assembly 102 and the guide frame 122, in order to prevent leakage of EMI. Such EMI may be generated internally by the module assembly 102, or externally by devices of the host equipment. The gaskets 228, 230, 434, 436 are connected to electrical ground, first through engagement with the bezel 108 which is grounded to the host chassis, and also through the guide frame 122 which has pins or leads 142 that are connected to ground on the host board 106 on which the guide frame 122 is mounted (as best illustrated in FIG. 1). Thus, EMI which impinges on the guide frame 122 or on the gaskets 228, 230, 434, 436 is effectively directed to electrical ground.

More particularly, in an exemplary embodiment, gaskets 228, 230, 434, 436 are fabricated from a conductive material such as thin copper alloy sheets. Top and bottom gaskets 228, 230 extend substantially the length of top and bottom edges 424, 426, respectively, of the front end 422 of the guide frame 122. Top and bottom gaskets 228, 230 are mirror images of one another when installed on the front end 422, and each of the top and bottom gaskets 428, 430 includes a bridge 440 that overlies respective edges 424, 426, a clip section 442 that hooks over the respective edge 424, 426, and straps 438 extending from the bridge 440 on an opposite side of the hook portion 442. The clip section 442 forms a groove which hooks over an exterior surface of the front end 422 of the guide frame 122. As best seen in FIG. 13, the straps 438 are curved and extend inwardly into the opening 136 while a distal end thereof is flared outwardly with respect to the opening and is in contact with a respective one of the side walls 132, 134 of the guide frame 122. While in the illustrated embodiment, eight straps 438 are provided on each of the top and bottom gaskets 228, 230, it is recognized that greater or fewer straps 438 may be provided in further and/or alternative embodiments. By substantially covering a majority of the top and bottom edges 440, 442 with gaskets 228, 230, a shielded EMI interface is provided along the top and bottom edges 440, 442.

Similarly, left and right gaskets 434, 436 are mirror images of one another when installed on the front end 422, and each of the left and right gaskets 434, 436 includes a bridge 444 that overlies respective left and right edges 428, 430 of the front end 422, a clip section 446 that hooks over the respective left and right edge 428, 430, and straps 438 as described above extending from the bridge 444 on an opposite side of the hook portion 446. The clip section 446 forms a groove which hooks over an exterior surface of the front end 422 of the guide frame 122. While in the illustrated embodiment, three straps 438 are provided on each of the left and right gaskets 434, 436, it is recognized that greater or fewer straps 438 may be provided in further and/or alternative embodiments. By substantially covering a majority of the left and right edges 428, 430 with gaskets 434, 436, a shielded EMI interface is provided along the left and right edges 428, 430.

In a particular embodiment, adjacent straps 438 of gaskets 228, 230, 434, 436 are separated from one another by narrow slots of about 1 mm or less, and the straps 438 include widths that are substantially greater than widths of the slots to provide adequate EMI shielding for data transmission rates of 10 Gbs. It is recognized, however, that relative dimensions of the slots and widths of the straps may be varied in alternative embodiments.

Gaskets 228, 230, 434, 436 are separately secured to the front end 422 of the guide frame 122 forming the opening 136. Specifically, the gaskets 228, 230, 434, 436 are attached to the front end 422 via engagement openings 446 that align with openings 448 in the front end 422 of the guide frame 122. The collar 231 receives the bridge 440, 444 of the gaskets 228, 230, 434, 436, and includes retaining pins or tab 450 which extend through openings 446, 448 and connects the gaskets 228, 230, 434, 436 to the front end 422. The collar 231 is secured over the front end 422 of the guide frame 122 and the collar 231 encloses the edges of the front end 422, the bridges 440, 444, and a portion of the clip sections 442, 446 to secure the EMI gaskets 228, 230, 434, 436 to the guide frame 122.

Collar 231 includes a flat and smooth outer surface 452 that provides an uninterrupted and continuous EMI shielding interface with a bezel 108. Additionally, the outer surface 452 of the collar 231 compressively engages a gasket 233 (shown in FIG. 4) that is fastened to the interior surface of bezel 108 (shown in FIGS. 1 and 4).

In an exemplary embodiment, the collar 231 is fabricated from a conductive material, such as aluminum or zinc in a known die-casting operation. In alternative embodiments, collar 231 may be fabricated from other known materials and according to other processes and techniques familiar to those in the art. As shown in FIGS. 11 and 12, the collar 231 is formed into a complementary shape to the front end 422 of the guide frame 122, and thus in the illustrated embodiment is substantially rectangular. Retaining pins 450 extend inwardly from a flat inner groove 460 that receives the forward end 422. The pins 450 extend slightly into the opening 462 through the collar 231. A lip 464 is formed adjacent a perimeter of the opening 462 which abuts respective portions of the gaskets 228, 230, 434, 436 when the collar 231 is installed, as shown in FIG. 13.

Figure 14:
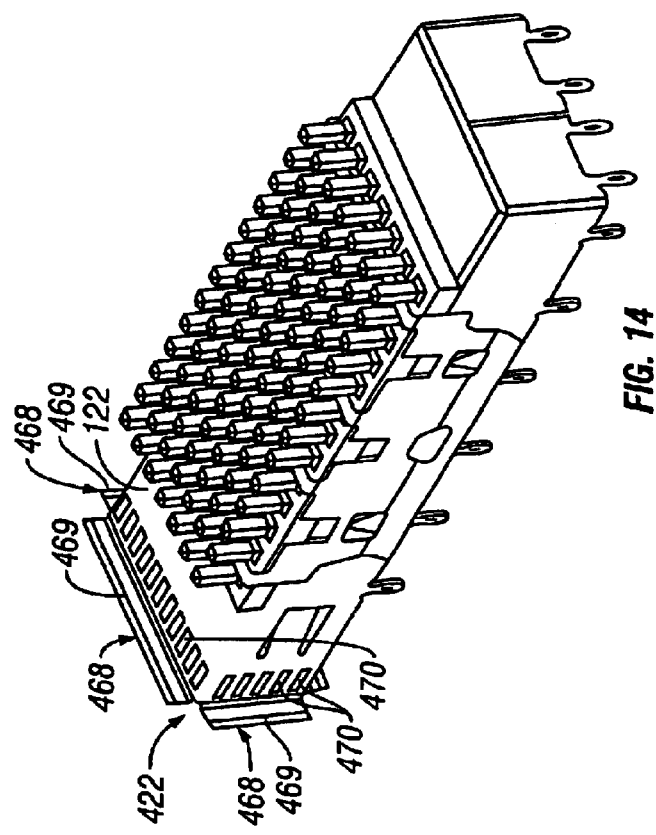
FIG. 14 is a perspective view of an alternative embodiment of module interface of a receptacle assembly.

FIG. 14 illustrates an alternative embodiment wherein the front end 422 of the guide frame 122 includes separately provided gaskets 468 coupled to each of the edges the front end 422. The gaskets 468 include flanges 469 extended outwardly from the edges of the front end 422 in a substantially perpendicular fashion. The flanges 468 are configured to abut gasket 233 (shown in FIG. 4) that is secured to the bezel 108 (shown in FIGS. 1 and 4) to provide EMI shielding for the front end 422. A number of notches 470 are formed into the walls of the guide frame 122 adjacent the gaskets 468. The notches 470 receive straps of the gaskets 468 which extend into the interior of the guide frame 122 and provide grounding contact with the module assembly 102 in the manner described above.

Figure 15:
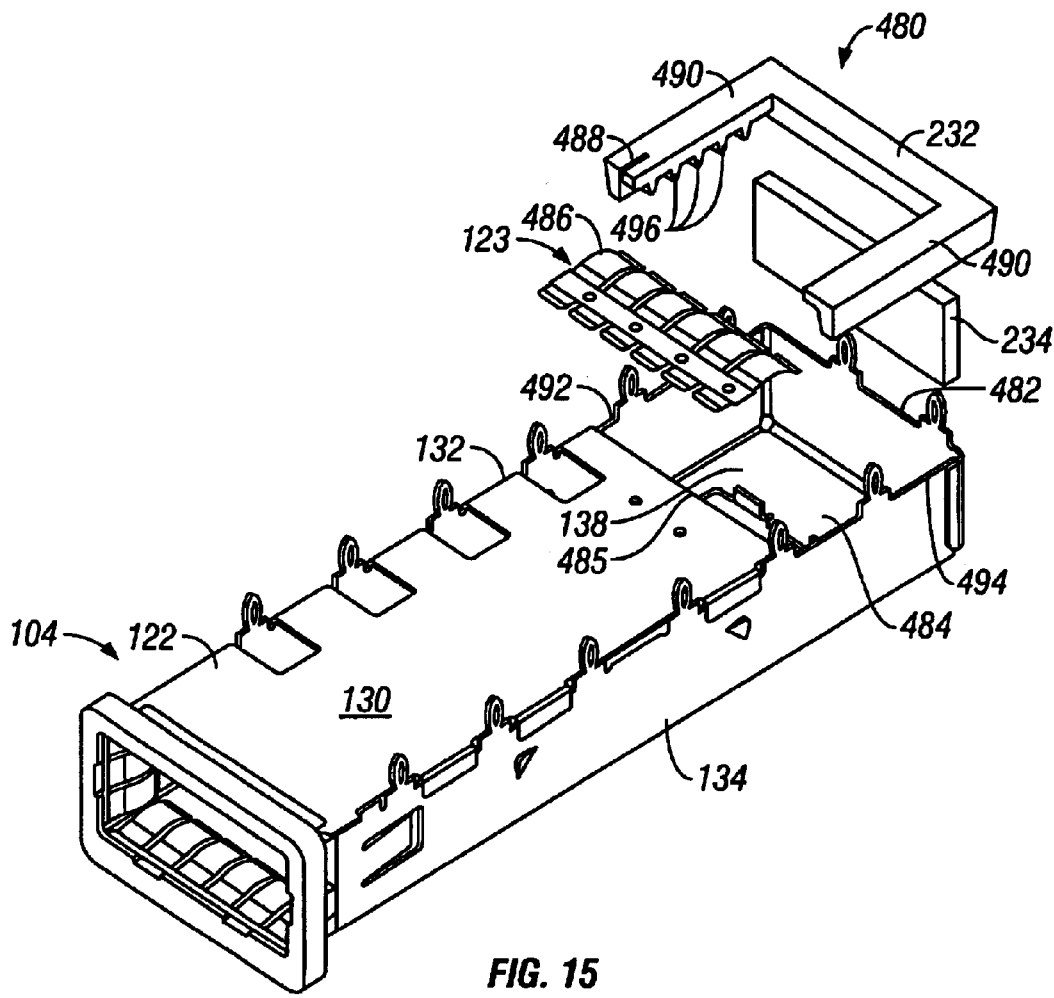
FIG. 15 is a bottom perspective assembly view of the circuit board interface of the receptacle assembly including an electromagnetic interference shielding gasket assembly formed in accordance with an embodiment of the invention.

FIG. 15 is a bottom perspective assembly view of the receptacle assembly 104 as it interfaces with the host board 106 (shown in FIG. 1) in the vicinity of the receptacle connector 120 (shown in FIG. 1). As illustrated in FIG. 4, printed circuit board 220 (shown in FIG. 4) within the module assembly 102 is engaged with the connector receptacle 120 in a bottom rear of the guide frame 122 Referring back to FIG. 15, an electromagnetic interference shielding gasket assembly 480 is accordingly provided in the bottom rear of the guide frame 122.

A rear cap 482 is attached to a rear of the guide frame 122 to close off an opening 484 through a bottom wall 130 of the guide frame 122. Intermediate EMI gasket 123 is provided along a forward or leading edge 485 of the opening 484, and the intermediate gasket 123 includes contact straps 486 extending into the cavity 138 in a similar manner to those described above. The contact straps 486 extend along the leading edge 485 of the opening 484 as the module assembly 102 is inserted into the guide frame 122, as also illustrated in FIGS. 4 and 5. The straps 486 have widths sufficient to cover a substantial majority of the leading edge 485 to form a shielded interface along the leading edge 485. The straps 486 brush a bottom surface of the module assembly 102 as the module assembly 102 is inserted into the guide frame 122. The straps 486 are deflected by the module assembly 102 and provide a conductive path from the module assembly 102 to the chassis ground of the host equipment. In an exemplary embodiment, the straps 486 establish an electrical path to the conductive surface 146 (shown in FIG. 1) of the host board 106, which is in turn electrically connected to an electrical ground.

A lower rear EMI gasket 232 is provided extending along the rear cap 482 and side portions 492, 494 of the opening 484 to provide further EMI shielding. In an exemplary embodiment, the gasket 232 is fabricated from a rubber elastomer containing conductive particulate material and formed into a U-shaped skirt fitting the rear end of the guide frame 122. A groove 488 is formed in gasket 232 which receives an edge of the guide frame 122, as also illustrated in FIG. 4. The gasket 232 includes a stepped contour in cross section that extends along different parallel planes on either side of the groove 488. The gasket 232 is compressible and compressed against the conductive surface 146 (shown in FIG. 1) on the host board 106 (shown in FIG. 1) to form a continuous and uninterrupted shielded interface along the side and rear edges of the bottom opening 484 when the guide frame 122 is installed to the host board 106 (shown in FIG. 1).

In an illustrative embodiment, the EMI gasket 232 includes a flexible base portion 490 fitting along the side edges 492, 494 of the bottom opening 484 and configured to rest on the conductive layer 146 (FIG. 1) provided on the host board 106 (FIG. 1). The base portion 490 is formed integrally with a series of flexible serrated teeth 496 on interior surfaces thereof. The teeth 496 project upward into the interior cavity 138 of the guide frame 122 through the bottom opening 484. The serrated teeth 496 are disposed adjacent each of the side walls 132, 134 of the guide frame 122 in the interior of the cavity 138 of the guide frame 122. The serrated teeth 496 extend from the bottom opening 484 into the interior cavity 138. As such, the serrated teeth 496 are oriented to engage the module assembly 102 when installed into the guide frame 122.

An upper EMI gasket 234 is disposed within the interior cavity 138 of the guide frame 122 proximate a rear end of the guide frame 122. In the illustrated embodiment, gasket 234 is a conductive foam pad adhered to the rear cap 482 of the guide frame 122 and in an abutting relationship with lower EMI gasket 232. Conductive foam materials suitable for fabrication of the gasket 234 are commercial available, for example, from Laird Technologies of Delaware Water Gap, Pa.

By separately providing EMI gaskets 123, 232, 234 on the front edge 485, the side edges 492 and 494 and the rear cap 482 of the bottom opening 484, effective EMI shielding is provided about the interface between the receptacle connector 120 and the module assembly 102.

Figure 16:
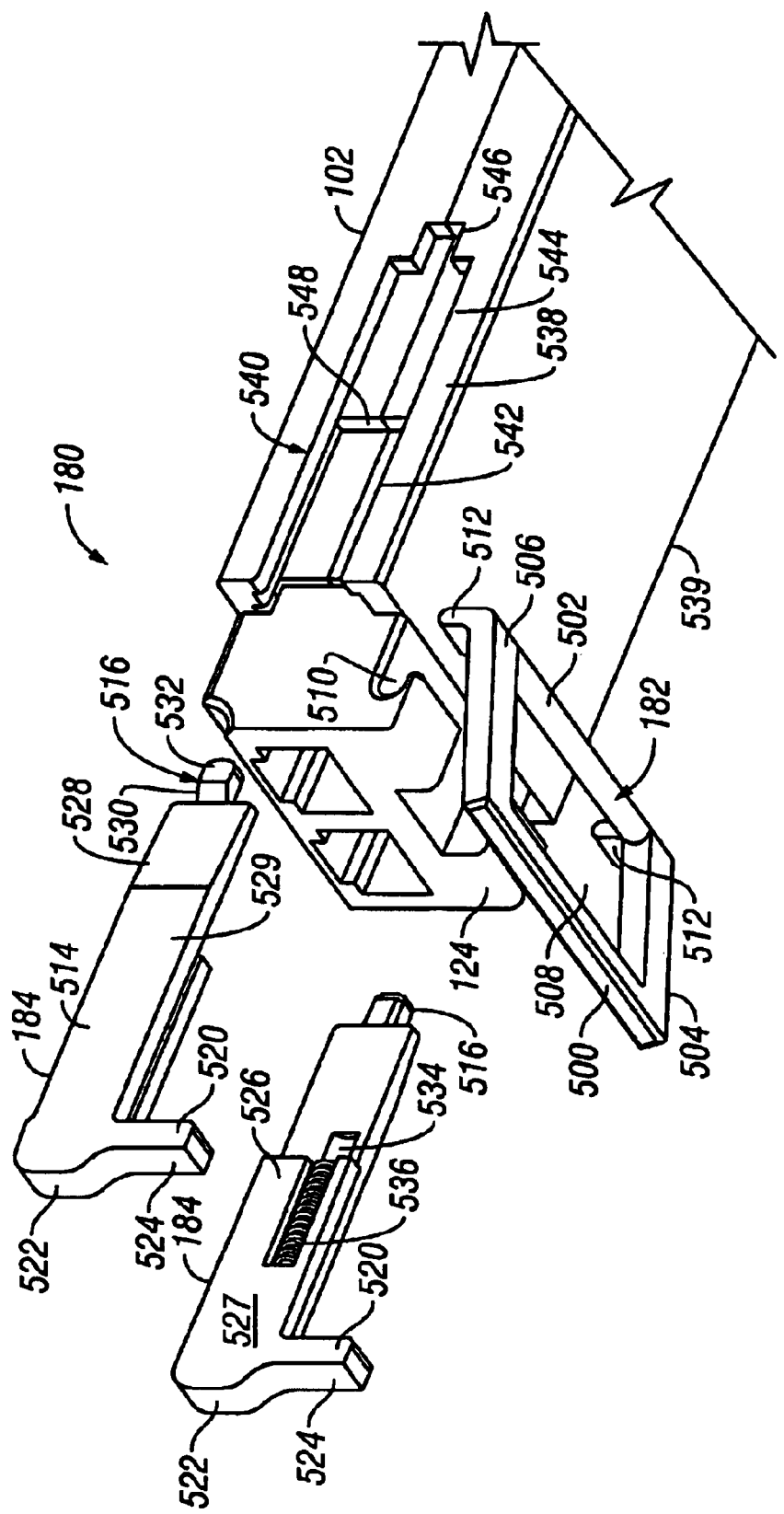
FIG. 16 is a front perspective assembly view of the module assembly shown in FIGS. 1 and 3–5 illustrating an ejector mechanism formed in accordance with an embodiment of the invention.

FIG. 16 is a front perspective assembly view of the module assembly 102 shown in FIGS. 1 and 3–5 illustrating an ejector mechanism 180 formed in accordance with an embodiment of the invention.

The module assembly 102 includes a pair of actuator arms 184 which are mirror images of one another and cooperate with a bail 182 to release the module assembly 102 from the latched position and to eject the module assembly 102 from the receptacle assembly 104 (shown in FIG. 1). Bail 182 is a generally rectangular body having a top side 500, a bottom side 502, and left and right sides 504, 506 defining an opening 508 which is dimensioned to receive the connector interface 124 of the module assembly 102. The connector interface 124 includes a slot 510 formed in a lower end thereof, and the bottom side 502 of the bail 182 is received in the slot 510 to pivotally mount the bail 182 to the module assembly 102. An angled foot portion 512 extends from each the lower corners of the bail 182 at the intersection of the bottom side 182 and the left and right sides 504, 506.

The actuator arms 184 include a main body portion 514 including an axially extending ejector tab 516, and a foot portion 520 extending substantially perpendicularly to the main body portion 514. A latched contact stop portion 522 extends on an opposite end of the main body 514 from the ejector tab 516 and extends outwardly from a forward end 524 of the foot portion 520. The main body portion 514 includes a stepped contour 526 on an interior surface 527 thereof and a tapered leading end 528 on an exterior surface 529. The tapered leading end 528 has a gradually reduced thickness to form a ramped surface extending to the ejector tab 516. The ejector tab 516 has a reduced width relative to the main body portion 514 and includes a ramped surface 530 extending to a raised boss 532.

The ramped surface 530 of the ejector tab 516 is inclined oppositely to the tapered leading end 528 of the actuator arm 14. That is, while tapered leading end 528 is reduced in thickness in an axial or longitudinal direction of the main body 514, the ramped surface 530 of the ejector tab 516 is increased in thickness from the leading edge 528 of the main body 514 to the boss 532 of the ejector tab 516. Thus, in a given orientation, if the tapered end 528 has a positive slope, the ramped surface 530 has a negative slope, or vice-versa. As illustrated in FIG. 16, the tapered end 528 and the ramped surface 530 are arranged side-by-side in a valley configuration and thus are sloped toward one another. Also, the angle of inclination of the ramped surface 530 is substantially steeper than the angle of inclination of the tapered end 528. The interior surface 527 of each actuator arm 184 includes a longitudinal slot 534 which houses a bias element 536, such as a coil spring an exemplary embodiment. The bias element 536 provides spring-loaded release actuation of the module assembly 102 as the bail 182 is manipulated by a user.

The module assembly 102 includes a retention cavity 540 on each of the side walls 538, 539 thereof, and the retention cavities 540 are shaped generally complementary to the outer profile of the respective actuator arms 184. Thus, each of the retention cavities 540 includes a first portion 542, a second portion 544, and a third portion 546. The first portion 542 has a width slightly larger than a width of the main body portion 514 of the actuator arm 184 and a depth substantially equal to a full depth of the main body portion 514 (i.e., the depth of the thicker portion of the stepped contour 527 of the actuator arms 184). The second portion 544 has a width substantially equal to the first portion but a depth substantially equal to the reduced depth of the main body portion 514 adjacent the tapered leading end 528 (i.e., the depth of the thinner portion of the stepped contour 527 of the actuator arms 527). The third portion 546 has a substantially equal depth to the second portion 544 but a reduced width that is slightly larger than a width of the ejector tab 516. The first and second portions 542, 544 of the retention cavity 540 are configured to accept the stepped contour 527 of the main body portion 514 of the actuator arms 184, and the third portion 546 is configured to receive the ejector tab 516 with sliding engagement. A shoulder 548 separates the first portion 542 from the second portion 544 and provides an abutment or seat for the bias element 536 of the actuator arm 184.

When actuator arms 184 are received in the respective retention module cavities 540 of the module assembly 102 and when the bail 182 is mounted to the connector interface 124 and rotated upward so that foot portions 512 of the bail 182 contact the foot portions 520 of the actuator arms, the ejector mechanism 180 is engaged and ready for use.

Figure 17:
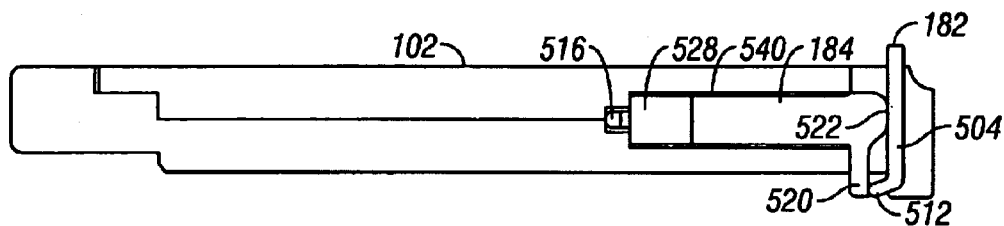
FIG. 17 is a side elevational view of the module assembly illustrating the ejector mechanism in a latched position.

FIG. 17 is a side elevational view of the module assembly 102 with the actuator arms 184 received in the retention cavity 540 and the bail 182 in the latched position. As the module assembly 102 is inserted into the receptacle assembly 104, the retention tabs 516 contact the latch elements 196 (shown in FIGS. 4 and 5) of the guide frame 122 (shown in FIGS. 4 and 5) and deflect the latch elements 196 outwardly to allow the module assembly 102 to be inserted into the guide frame 122 (FIGS. 4 and 5). When the module assembly 102 is fully inserted, the retention tabs 516 clear the latch elements 196, and the latch elements 196 deflect inwardly and rest upon the tapered leading ends 528 of the actuator arms 184. The retention tabs 516 therefore become latched behind the latch elements 196 of the guide frame 122 when the module assembly 102 is fully installed in the guide frame 122.

In the latched position, the bail 182 is positioned substantially upright with the foot portions 512 of the bail 182 contacting the foot portions 520 of the actuator arms. The latched contact stop portions 522 of the actuator arms 184 contact the sides 504, 506 (shown in FIG. 16) of the bail 182. The bias element 536 (shown in FIG. 16) is loaded in compression and maintains the bail 182 in the latched position. Foot portions 512 of the bail 182 extend at an obtuse angle relative to sides 504, 506 (FIG. 16) of the bail 182 and are rounded at the point of contact with the foot portions 520 of the actuator arms 182.

Figure 18:
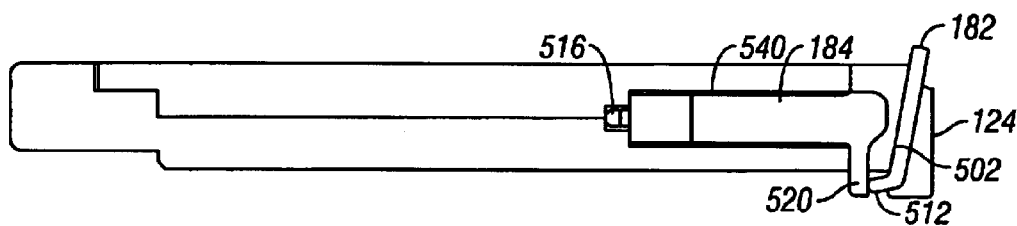
FIG. 18 is a side elevational view of the module assembly illustrating the ejector mechanism in a first intermediate position.

FIG. 18 is a side elevational view of the module assembly 102 illustrating the ejector mechanism in a first intermediate position as the bail 182 is pivoted about its lower end 502 to actuate the mechanism and release the module assembly 102 from the receptacle assembly 104. The bail 182 is pivoted away from the interface connector 124 (clockwise in FIG. 18) about its lower end, and the foot portions 512 of the bail 182 slide upwardly against the foot portions 520 of the actuator arms 184. The angled foot portions 512 cause the actuator arms 184 to move longitudinally inward (to the left in FIG. 18) into the retention cavities 540, thereby further loading the bias elements 536 in the actuator arms 184.

Figure 19:
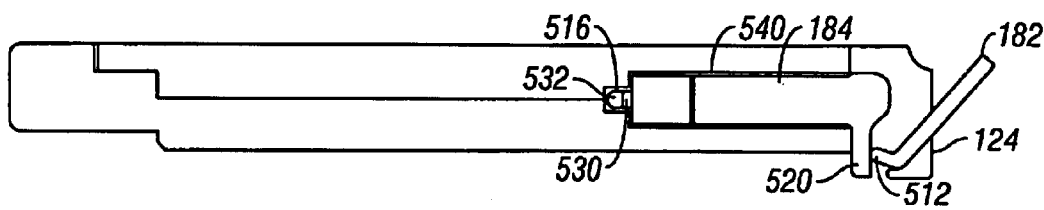
FIG. 19 is a side elevational view of the module assembly illustrating the ejector mechanism in a second intermediate position.

FIG. 19 is a side elevational view of the module assembly 102 illustrating the bail 182 pivoted to a second intermediate position wherein the foot portions 512 of the bail 182 are positioned relative to the foot portions 520 of the actuator arms such that the bias elements 536 are compressed to a maximum load. Further pivoting of the bail 182 from this position permits the bias elements 536 to relax and push the actuator arms 184 forward toward the connector interface 124. At this point, the latch elements 196 of the guide frame 122 are in contact with the ramped surfaces 530 of the ejector tabs 516 of the actuator arms 184. As the bias elements 536 force the actuator arms 184 in a forward direction (to the right in FIG. 19), the ramped surfaces 530 deflect the latch elements outwardly until the boss 532 clears the latch elements 196.

Figure 20:
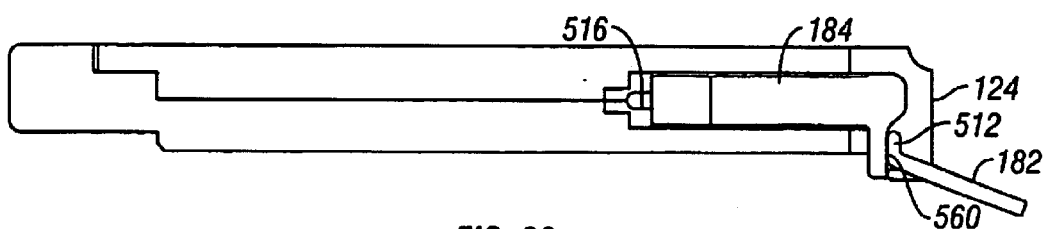
FIG. 20 is a side elevational view of the module assembly illustrating the ejector mechanism in an unlatched position.

FIG. 20 is a side elevational view of the module assembly 102 illustrating the bail 182 in an unlatched position wherein a flat bottom surface 560 of the bail foot portions 512 are flush against the foot portions 520 of the actuator arms 184. The actuator arms 184 are displaced forwardly by the bias elements 536, and the retention tabs 516 are released from the latch elements 196 of the guide frame 122. In the unlatched position, the module assembly 102 may be removed from the receptacle assembly 104 by pulling the bail 182 to slide the module assembly 102 out of the receptacle assembly 104. The bias elements 536 maintain the bail 182 in the latched position until the bail 182 is actuated to the latched position described above.

The bail 182 is pivoted back toward the connector interface 124 to position the actuator arms 184 back to the latched position (shown in FIG. 17) wherein the retention tabs 516 may be engaged to the latch elements 196 (FIGS. 4 and 5) of the receptacle assembly 104.

Figure 21:
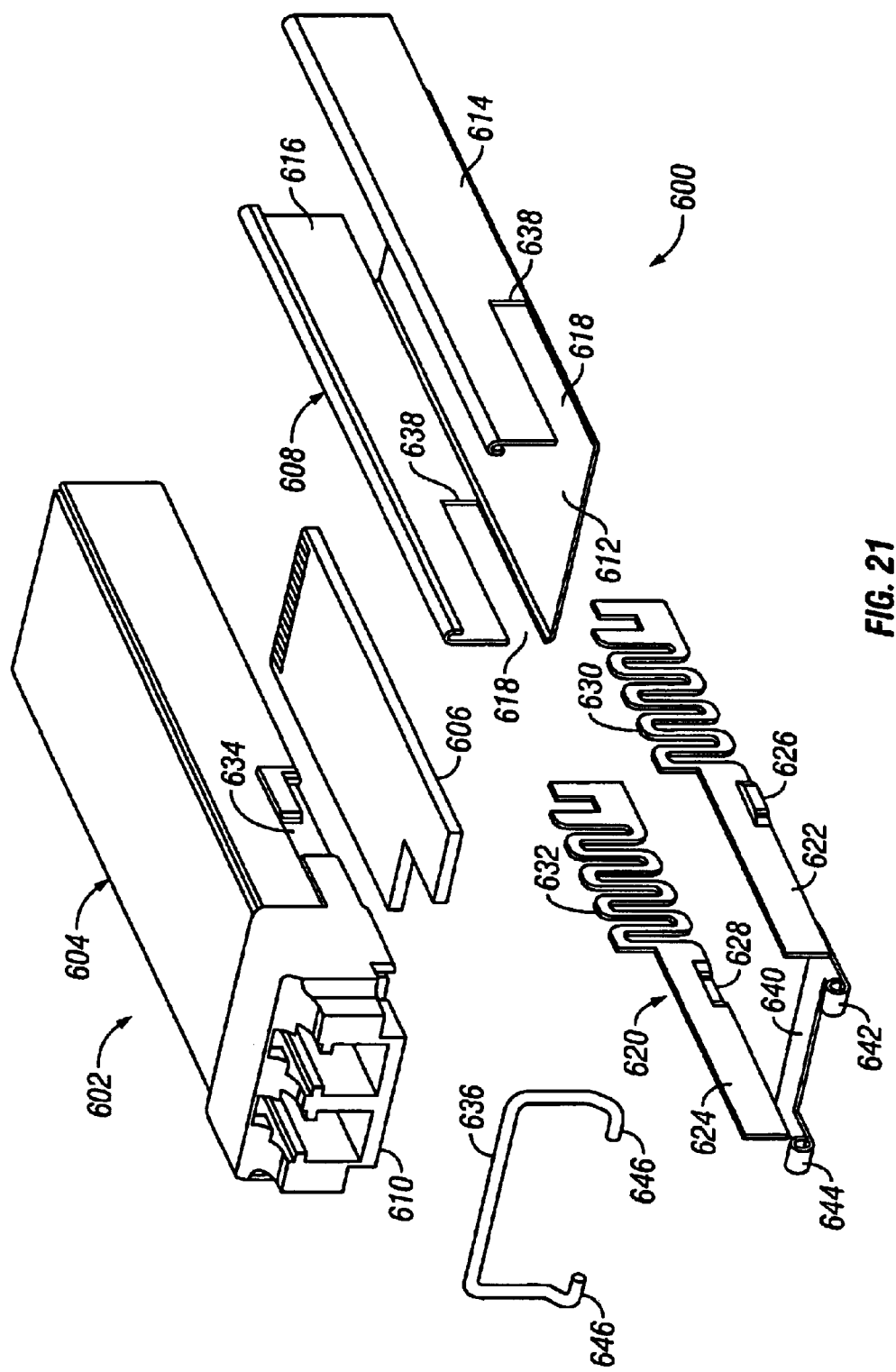
FIG. 21 is an exploded assembly view of a second embodiment of an ejector mechanism for a module assembly.

FIG. 21 illustrates an alternative embodiment of an ejector mechanism 600 for releasing a module assembly 602 from the receptacle assembly 104 described above. The module assembly 602 includes a base 604, a printed circuit board 606, and a cover 608 with an attached connector interface 610. Printed circuit board 606 is configured for transceiver functions and is capable of 10 Gbs data signal rate transmission, and the module assembly 602 interfaces with the receptacle connector 120 of the receptacle assembly 104 as described above.

The cover 608 includes a flat bottom wall 612 and opposite side walls 614, 616 extending substantially perpendicular to the bottom wall 612. Notches or cut-outs are formed in the leading edges of the side walls 614, 616 which receive an actuator 620. The actuator 620 includes two longitudinal members or actuator arms 622, 624 including respective outwardly extending ejector tabs 626, 628 extending therefrom, and respective resilient re-set bias elements 630, 632 extending axially and integrally with the actuator arms 622, 624. The actuator 620 includes a cross bar 640 extending between the actuator arms 622, 624, and the cross bar 340 extends beneath the connector interface 610 when the actuator 620 is installed. Clips 642, 644 extend forwardly from the cross bar 640 and provide a bracket for receiving foot portions 646 of a bail 636 to pivotally mount the bail 636 to the module 602.

In the illustrated embodiment, the actuator 620 is a stamped metal part formed as a single-piece unit such that the bias elements 630, 632 are substantially coplanar with the actuator arms 622, 624 in a serpentine configuration. It is understood, however, that actuator 620 could in alternative embodiments be fabricated from multiple pieces and a variety of materials according to known processes and techniques.

When the module assembly 602 is assembled and fully inserted into the guide frame 122 (FIGS. 4 and 5), the retention tabs 196 (FIGS. 4 and 5) on the guide frame 122 enter respective cavities 634 in the module assembly cover 608, thereby preventing withdrawal of the module assembly 602 from the guide frame 122. Pulling on the bail 636 extends the bias elements 630, 632 and causes angled surfaces on the ejector tabs 626, 628 to deflect the latch elements 196 (FIGS. 4 and 5) outwardly, thereby removing the latch elements 196 from the module assembly cavities 634 and permitting withdrawal of the module assembly 602 from the guide frame 122. When the bail 636 is released the bias elements 626, 632 are unloaded and return the ejector tabs 622 to their normal position in engagement with rear edges 638 of the notched portions 618 of the cover 608.

While the invention has been described in terms of various specific embodiments, those skilled in the art will recognize that the invention can be practiced with modification within the spirit and scope of the claims.

What is claimed is:

1. An electrical module assembly configured for latching engagement with a receptacle assembly adapted for mounting to a printed circuit board, said electrical module assembly comprising:

an ejector mechanism comprising at least one actuator arm adapted to extend longitudinally along a respective one of opposite side walls of the receptacle assembly, said actuator arm comprising an ejector tab extending longitudinally therewith, and configured to deflect a latch tab of the receptacle assembly, and a bias element extending longitudinally with and in contact with said actuator arm.

2. An electrical module assembly in accordance with claim 1, said at least one actuator arm comprising a tapered leading end adjacent said ejector tab and inclined toward said ejector tab, said ejector tab comprising a ramped surface oppositely inclined to said tapered leading end.

3. An electrical module assembly in accordance with claim 1, said at least one actuator arm comprising an interior surface comprising a stepped contour.

4. An electrical module assembly in accordance with claim 1, said at least one actuator arm comprising an interior surface having a slot therein, one of said bias elements located in said slot.

5. An electrical module assembly in accordance with claim 1 wherein said bias element extends coplanar to said actuator arm.

6. An electrical module assembly in accordance with claim 1 wherein said at least one actuator arm comprises a foot portion extending substantially perpendicular to a longitudinal axis of said actuator arm.

7. An electrical module assembly in accordance with claim 1 further comprising a pivotally mounted bail in contact with said at least one actuator arm.

8. An electrical module assembly in accordance with claim 1 further comprising a pivotally mounted bail, said bail comprising at least one foot portion extending at an obtuse angle therefrom, said foot portion in contact with said at least one actuator arm.

9. An electrical module assembly in accordance with claim 1 wherein said at least one actuator arm comprises a first actuator arm and a second actuator arm, said assembly further comprising a cross bar extending between said first and second actuator arms, said cross bar comprising first and second clips configured to receive a bail.

10. An electrical module assembly in accordance with claim 1 wherein said at least one actuator arm comprises a longitudinally extending main body, an ejection tab extending longitudinally from said body, and a foot portion extending laterally from said body.

11. An electrical module assembly in accordance with claim 1 wherein said ejector tab on said at least one actuator arm has a reduced width relative to a main body of said actuator arm.

12. An electrical module assembly configured for latching engagement with a receptacle assembly adapted for mounting to a printed circuit board, said electrical module assembly comprising:

first and second side walls, each of said first and second side walls including a retention cavity, each of said first and second side walls configured for slidable insertion into a guide frame of the receptacle assembly; and an ejector mechanism comprising first and second actuator arms adapted to extend longitudinally adjacent a respective one of opposite side walls of the guide frame, each of said arms comprising an ejector tab extending longitudinally therewith and configured to deflect a latch tab formed in each of the side walls of the guide frame, and a longitudinally extending bias element abutting each of said actuator arms.

13. An electrical module assembly in accordance with claim 12 wherein each of said actuator arms comprises a longitudinally extending main body, an ejection tab extending longitudinally from said body, and a foot portion extending laterally from said body.

14. An electrical module assembly in accordance with claim 12 wherein each of said actuator arms comprise a contoured stepped surface configured for slidable insertion into a retention cavity in each of the side walls of the module assembly.

15. An electrical module assembly in accordance with claim 12 wherein an interior surface of each of said actuator arms includes a slot, said slot containing a respective one of said bias elements, said bias element in seating engagement with a shoulder in a retention cavity in the module assembly.

16. An electrical module assembly in accordance with claim 12 further comprising a bail, said bail including a foot portion oriented at an obtuse angle therewith, said foot portion contacting a portion of an outer surface of said actuator arms and loading said bias element.

17. An electrical module assembly comprising:

a receptacle assembly comprising a guide frame having a top wall, a bottom wall and opposite side walls, each of said side walls comprising a latch tab therein;

a transceiver module assembly configured for insertion into said guide frame, said transceiver module assembly comprising opposite side surfaces extending adjacent said side walls of said guide frame when said module assembly is inserted into said guide frame, each of said side surfaces of the module assembly comprising a retention cavity for engagement with a respective one of said latch tabs of said receptacle assembly;

an ejector mechanism comprising first and second substantially parallel actuator arms adapted for sliding engagement with said retention cavities of said module assembly, said actuator arms positionable longitudinally adjacent a respective one of side walls of the guide frame, each of said arms comprising an ejector tab extending longitudinally therewith and configured to deflect a respective one of said latch tabs of said guide frame; and a bias element extending longitudinally with each of said actuator arms.

18. A module assembly in accordance with claim 17 further comprising a pivotally mounted bail comprising a foot portion oriented at an obtuse angle, said foot portion contacting said bail in a latched position and in an unlatched position.

19. A module assembly in accordance with claim 17 wherein said bias element extending longitudinally with each of said actuator arms is formed integrally therewith.

20. A module assembly in accordance with claim 17 wherein said retention cavities are shaped complementary to an outer profile of said contact arms.

21. A module assembly in accordance with claim 17 wherein each of said retention cavities includes a shoulder, said shoulder providing a seat for a respective one of said bias elements.

22. A module assembly in accordance with claim 17 wherein each of said actuator arms comprises an interior surface, said interior surface including a slot for retaining a bias element.

23. A module assembly in accordance with claim 17 wherein each of said actuator arms includes a stepped surface, each of said retention cavities configured to receive said stepped surface.

24. A module assembly in accordance with claim 17 wherein each of said actuator arms comprise a tapered leading end adjacent said ejector tab and inclined toward said ejector tab, said ejector tab comprising a ramped surface oppositely inclined to said tapered leading end.

* * * * *